United States Patent [19]

Treleaven

[11] Patent Number: 5,366,385
[45] Date of Patent: Nov. 22, 1994

[54] ELECTRONIC CIRCUIT MODULE AND EQUIPMENT RACK FOR THE MODULE

[75] Inventor: Paul J. Treleaven, Kent, United Kingdom

[73] Assignee: Avitel Electronics Ltd., London, United Kingdom

[21] Appl. No.: 78,834

[22] Filed: Jun. 21, 1993

[30] Foreign Application Priority Data

Oct. 15, 1992 [GB] United Kingdom ............... 9221711

[51] Int. Cl.⁵ .......................................... H01R 13/64
[52] U.S. Cl. .................................... 439/377; 439/64
[58] Field of Search ................ 439/31, 69, 376, 377

[56] References Cited

U.S. PATENT DOCUMENTS 3,869,185  3/1975  Teagno ...................... 439/377 X
4,941,840  6/1990  Okada ........................ 439/64 X

OTHER PUBLICATIONS

IBM Technical Disclosure Bulletin, vol. 33, No. 18, Jun. 1990, pp. 169–173.

Primary Examiner—Eugene F. Desmond
Attorney, Agent, or Firm—Nixon & Vanderhye

[57] ABSTRACT

An equipment rack assembly comprising a rack adapted to accommodate a plurality of electrical/electronic modules is characterised in that sliding followed by pivotal movement of the module on insertion into the rack brings electrical contacts on the module into mating engagement with electrical contacts carried on a bus mounted in the rack.

5 Claims, 5 Drawing Sheets

ELECTRONIC CIRCUIT MODULE AND EQUIPMENT RACK FOR THE MODULE

FIELD OF THE INVENTION

The present invention relates to equipment racks and more particularly to racks for modular electronic equipment especially but not exclusively for use in mounting video and audio signalling equipment such as that used in connection with the broadcasting of television signals.

BACKGROUND OF THE INVENTION

In one known type of equipment rack two side plates are interconnected by top and bottom transverse members to form an open-ended box structure. A vertical bus member divides the box structure internally into two compartments. One of the compartments is itself divided into bays each of which is adapted to accommodate a modular specific function circuit unit or card. Each such unit can be slid into or out of its associated bay. In its fully inserted position electrical contacts on the rear of the unit connect directly with electrical contacts on the vertical bus member. Connector units plug into the other side of the bus unit and are accommodated in the other compartment of the box-like structure.

A disadvantage of this known arrangement is that there is no flexibility in the way that the specific function units and the connector units can be interconnected, i.e. the whole arrangement is tailored to a specific requirement because of the constraints imposed by the vertical bus design positioned physically between the specific function units and the connector units.

In another known type of equipment rack instead of a vertical bus member which divides the box-like structure into two compartments there is a horizontal bus member which extends between the two side plates but does not divide the box-like structure into two compartments.

In this second arrangement the electrical connections between the units and the bus member are by means of ribbon connectors. Whilst this second arrangement gives more flexibility than the first arrangement it does have the disadvantages that there is a significant capacitance and consequent signal degradation due to the ribbon connections and a potential failure or at least a degradation in performance of the equipment due to the relatively large numbers of electrical connecting points or contacts involved.

The present invention is concerned with providing equipment rack arrangement which is an improvement on the above discussed prior art arrangements and which is particularly suitable where digital signalling and wide bandwidth analogue employed which demands that more stringent performance criteria have to be met than is the case with analogue signalling.

SUMMARY OF THE INVENTION

According to the present invention an equipment rack assembly of the kind in which a circuit board module or card is adapted to be inserted into a rack along a track to bring it into an operative position in relation to a circuit bus carried by the rack characterised in that the board, the track and the bus are so positioned and/or shaped that an initial inserting movement of the module or card brings contacts thereon into register or alignment with contacts on the bus and a further subsequent movement of the module or card in a different direction from the first movement brings the two sets of contacts into electrical contact with one another to thereby make electrical contact between the module/card and the bus, the sequence of movements being reversed in order to extract the module/card from within the rack.

More specifically, and preferably, the initial movement of the module/card is not parallel to the track but skew in relation to it, the second movement being a pivotable movement about the track to cause the electrical contacts carried on the module/card to move laterally with respect to the length of the track in order to bring the module/card contacts into mating electrical engagement with those on the bus.

BRIEF DESCRIPTION OF THE DRAWINGS

How the invention may be carried out will now be described by way of example only and with reference to the accompanying drawings in which:

FIGS. 1 to 4 show only a part of an equipment rack according to the present invention. One side of the rack has been omitted for clarity. These figures show only part of four bays although any required number can be provided. FIGS. 5 to 8 are side elevational views in which FIG. 5 shows one complete bay and FIGS. 6 to 8 show only part of only one bay.

Figure 1:
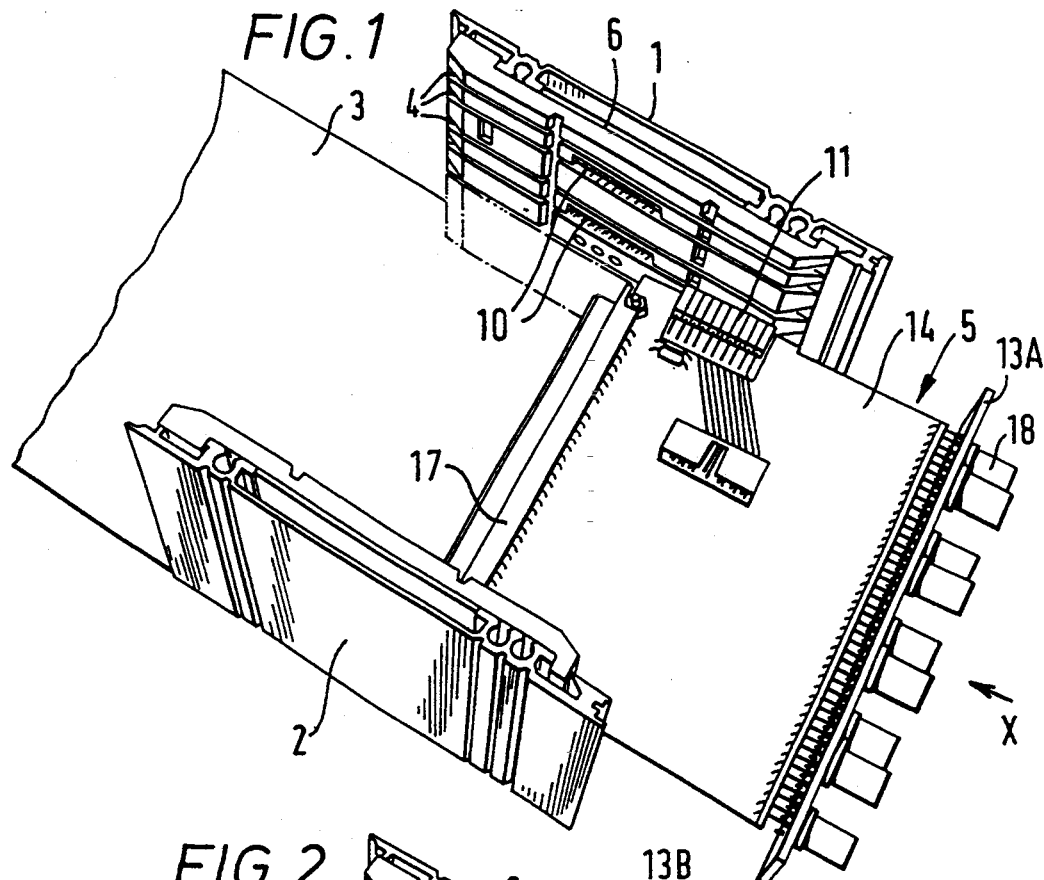
FIGS. 1 to 4 show, in perspective, a sequence of steps in the use of one embodiment of the invention.
Figure 2:
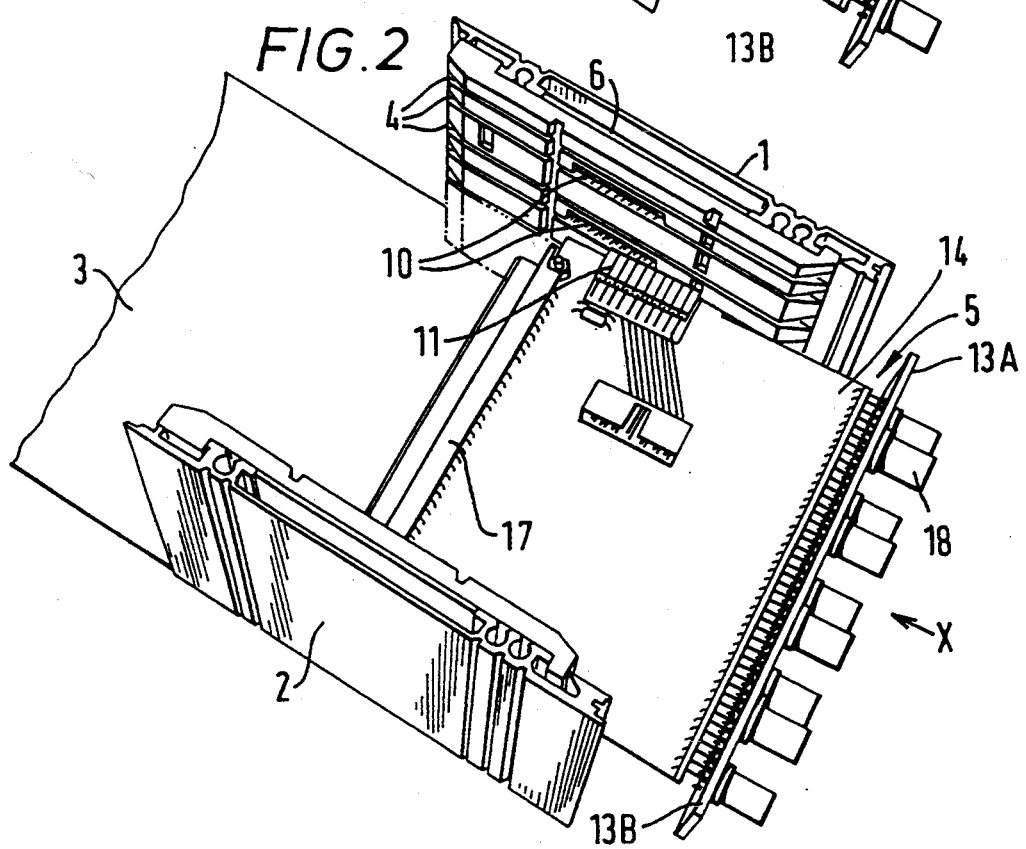

The rack has a top 1 and a bottom 2 and side members 3 (only one is shown in FIGS. 1 to 4).

The top 1 and bottom 2 are provided with grooves or tracks 4 into or out of which various circuit modules 5 can be slid. In its fully inserted position electrical contacts at the back of the unit 5 connect directly with electrical contacts on a bus member 6 carried in the top 1 of the rack.

The module 5 is a connector unit which could be to supply power, or for some other purpose, to a specific-function module (not shown) which is slidable into the opposite side of the rack to the module 5.

Electrical contact(s) is made between the two inserted units by means of a multi-pin connector carried at the rear of the module 5.

The way in which electrical connection between the module 5 and the bus 6 is achieved will now be described in more detail.

The bus 6 extends horizontally within the top 1 of the rack in contrast to the prior art arrangement in which the bus extends vertically across the width of the rack and in effect forms a partition within the rack to divide it into two compartments.

Power is supplied to the bus 6 from the connector unit 5 and signals are supplied to or from the bus 6 by the specific function module and/or the plug in connector unit.

The connector unit 5 comprises a front panel 13 to which a card 14 is secured, the rear of the card 14 carrying a DIN multi-pin connector 17.

The bus 6 is provided with groups of pins 10 by which electrical contact can be made with a mating set of electrical sockets 11 carried by the plug-in connector unit 5.

As stated earlier there are tracks 4 in the top 1 and bottom 2 of the rack 1 which are specially shaped to guide the plug-in unit connector 5 as it is inserted into the rack.

As stated earlier the connector unit 5 has a front panel 13 to which the card 14 is secured. The card 14 is provided with the electrical socket 11 mounted to one side of the card. The upper edge of the card has a specially shaped guide projection 15 which co-acts with the upper track 4A.

Figure 3:
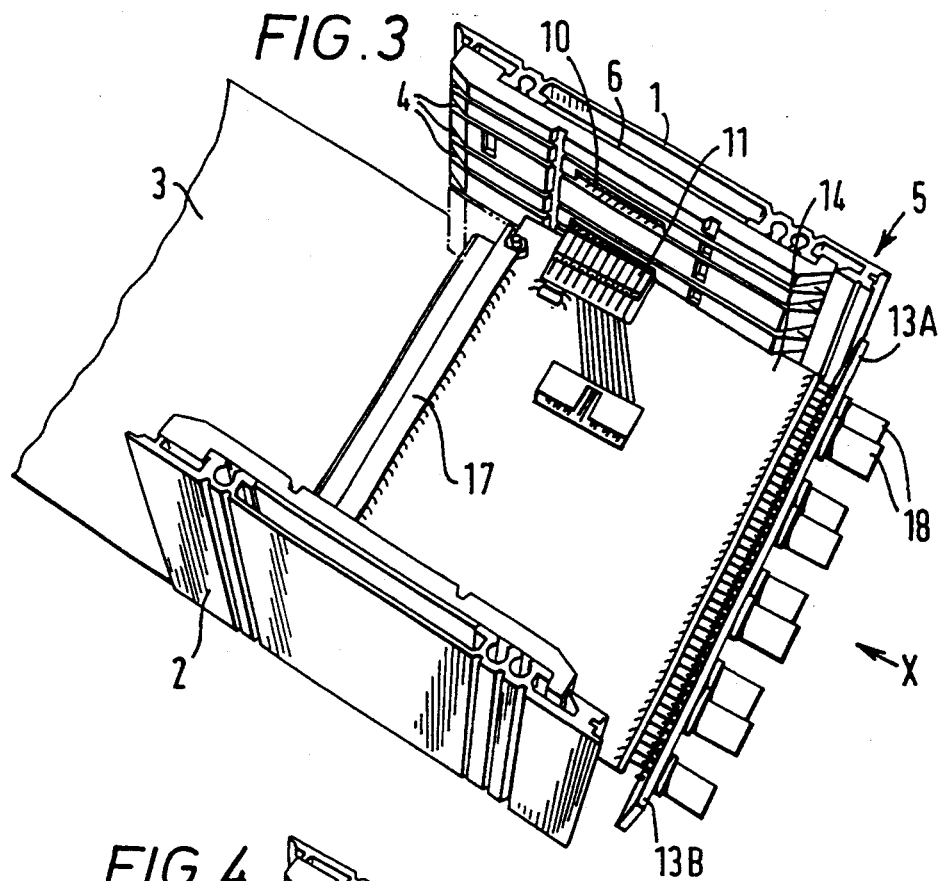
Figure 4:
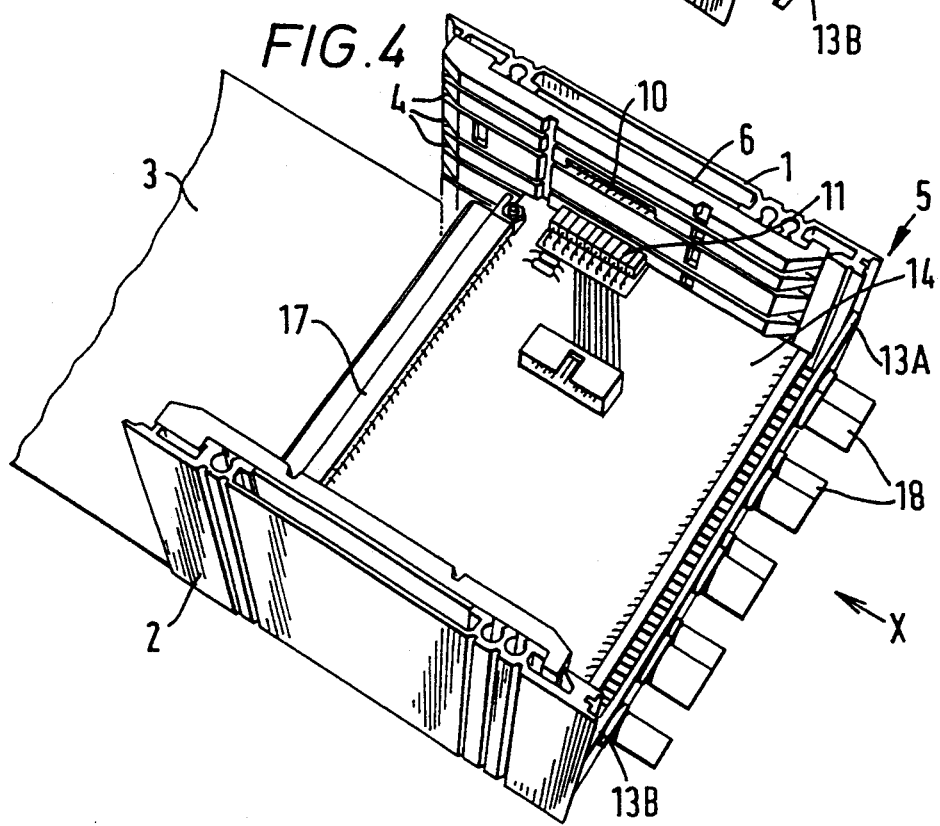
Figure 5:
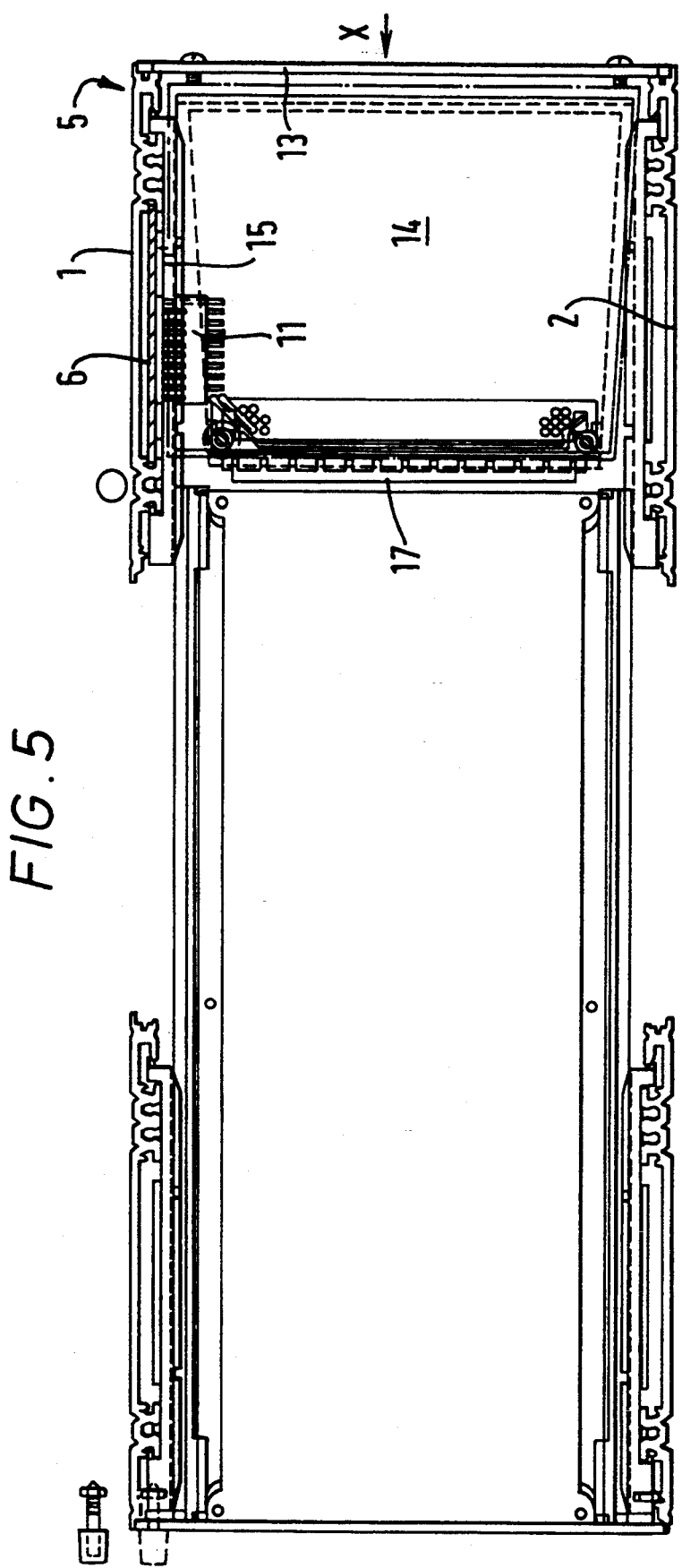
FIG. 5 is a simplified side elevational view of a single module or unit incorporating the embodiment of FIGS. 1 to 4.
Figure 6:
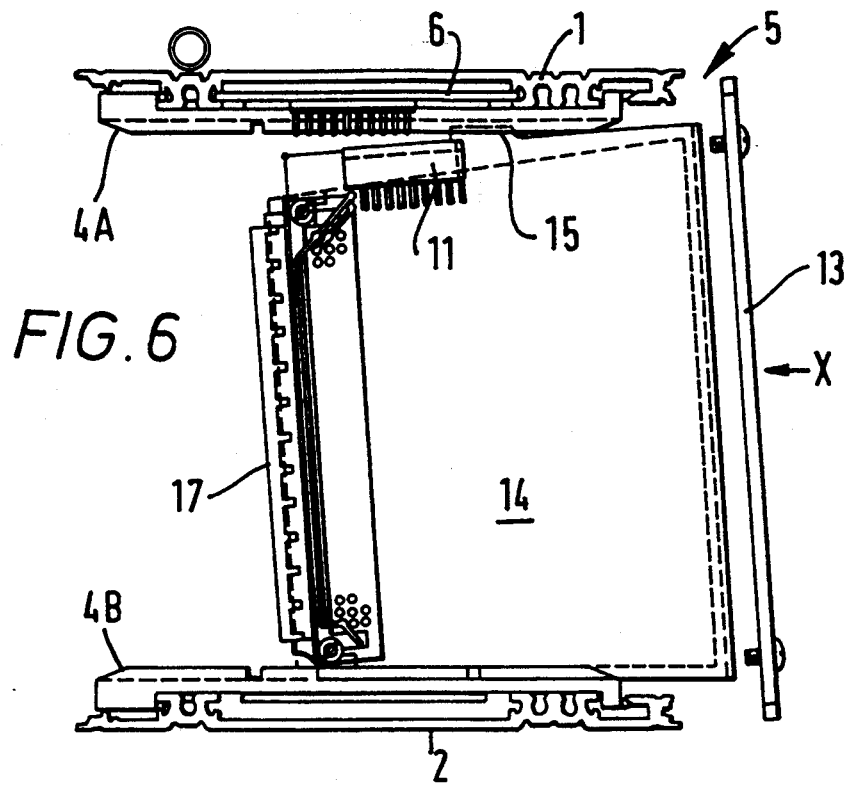
FIGS. 6 to 8 are views similar to FIG. 5 but corresponding to FIGS. 2 to 4 respectively.

The shapes of the tracks 4, and particularly the upper track 4A, and the projection 15 are such that the initial inserting movement of the card, indicated by the arrow X in the drawings FIG. 3, causes the card as a whole to skew with respect to the opening in the rack. In this embodiment the amount of skew is approximately four degrees.

Figure 7:
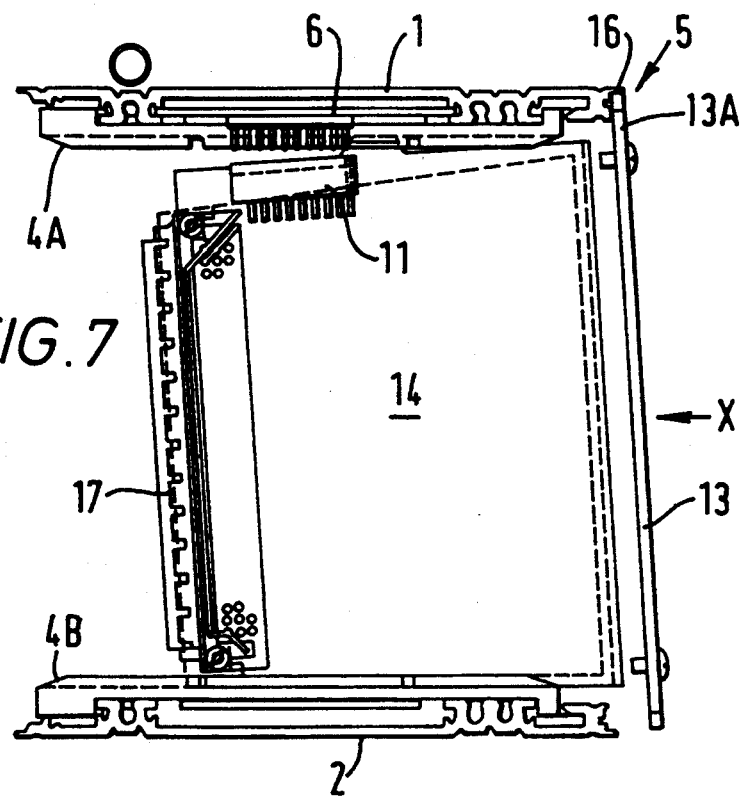

Further insertion of the card 14 brings the sockets 11 into register with the pins 10 carried by the bus as shown in FIGS. 3 and 7.

At this stage the top 13A of the front panel 13 of the unit abuts the end portion of the rack top 16 (see FIG. 7), this portion acting as a pivot point or fulcrum for the connector unit 5. At this stage the unit 5 as a whole is still skewed in relation to the rack 1, as shown in FIG. 7.

Figure 8:
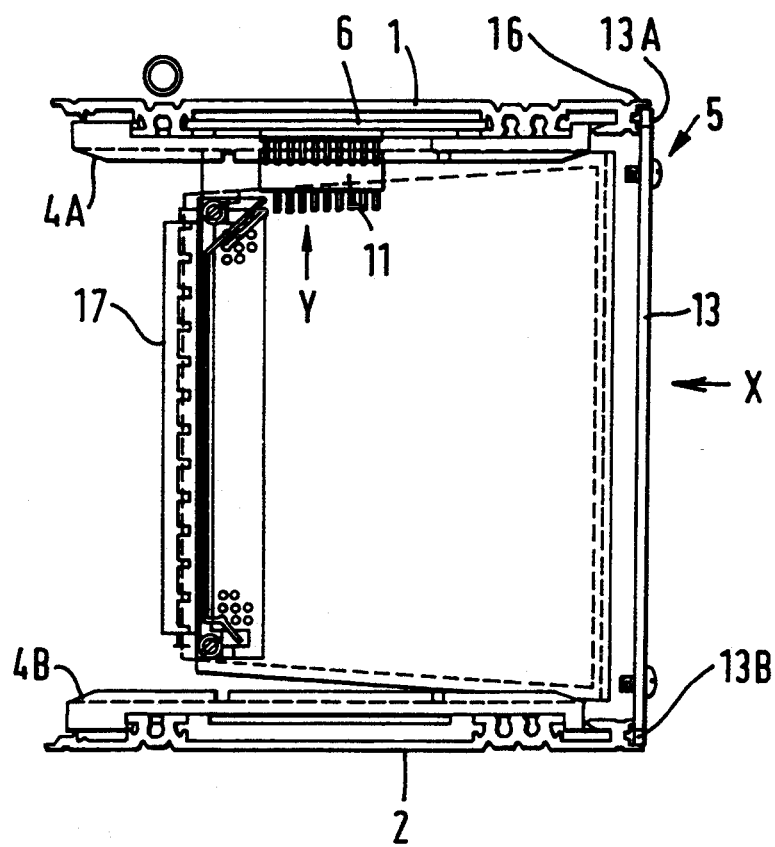

The bottom 13B of the front panel 13 is then pressed home against the end of the rack base 17 to cause the card to pivot about the point 16 to thus bring the socket 11 into electrical mating engagement with the pins 10 on the bus 7. This is achieved by lateral upward movement of these two members with respect one another, as indicated by the arrow Y in FIG. 8, only the front portion of the lower edge of the card then being in contact with the bottom track 12B.

Thus the way in which a unit 5 is inserted into an operative position within the rack 1 is first by a sliding movement followed by a pivotal movement.

A specific function module (not shown) can then be slid in from the other side of the rack so that a multi-socket connector on the rear of the module 6 engages the pins of a DIN multi-pin connector 17 to make electrical contact with the card 14 and indirectly with the bus 6 through the socket 11 and the pins 10.

The specific function modules slide or plug into the front of the rack enabling easy replacement by the user in the event of failure. In this embodiment the specific function module carries all the active circuitry. The connector unit 5 slides into the rear of the rack 1 and provides the means for connecting the specific function module to other equipment through plugs and sockets 18 (see FIGS. 1 to 4) The unit 5 also provides an interconnection from the specific function module to the bus 6. The connector unit 5 is essentially a passive interface although some versions are designed to contain active circuitry.

The drawings represent only one specific embodiment of the invention. Variations can be made within the general concept of a two-stage movement for bringing the unit into electrical contact with the bus and more particularly with the general concept of having the two-part movement consisting initially of a sliding movement followed by a pivotal movement.

As indicated earlier the present invention is particularly suitable for incorporation in modular equipment used in the transmission of analogue and digital broadcasting signals, such units being typically video switchers, audio distribution amplifiers and video distribution amplifiers.

I claim:

1. An equipment rack assembly comprising:
   at least one housing having two parallel walls, at least one recess formed in a first of said walls, a first electrical contact located in said recess, and electrically connected to a bus member adjacent said first wall, and a first pivot surface on a leading edge of said first wall;
   two parallel tracks each attached to an opposite wall, wherein a first of said tracks is mounted on said first wall, and aligned with said recess and said first electrical contact;
   a circuit module comprising a card and circuitry mounted on said card, wherein said circuit modifier is adapted to slide along said tracks between said walls, said modifier further comprises:
      a second electrical contact mounted adjacent a first side of said card, and adapted to engage said first electrical contact;
      a guide projection extending from a first side of said card, and adapted to slidably co-act with the first track;
      a front panel mounted on a transverse rear edge of said card, said panel having a second pivot surface adapted to contact and pivot about the first pivot surface;
   wherein said recess, guide projection, first and second pivot surfaces, and first and second electrical contacts are arranged so that the initial inserting movement of the card between the two walls causes the card to skew with respect to the tracks to allow the second electrical contact to clear the first track and the first electrical contact as the card slides inwardly along the tracks, and upon further insertion of the card, the first and second pivot surfaces contact causing the front panel and card to pivot about the two pivot surfaces to bring the first and second electrical contacts into electrical contact.

2. A digital signalling apparatus comprising:
   a plurality of bays each being adapted to receive an electronic card unit, each bay having a pair of parallel tracks to slidably receive a respective card unit, each pair of tracks having an associated first recess containing a first electrical contact, and
   each card refit having a second electrical contact and a projection adapted to engage one of the tracks such that the card unit is skewed in the tracks during an initial part of the insertion of the card unit into a respective bay; and at a terminal part of the insertion of the card trait into the respective bay, the projection slides into the associated first recess to pivot the card emit to effect a lateral movement of the first and second connectors that brings the connectors into mating electrical engagement with a bus connecting said plurality of bays.

3. Apparatus as in claim 1 or 2 in which the first electrical contact comprises an electrical socket assembly and said second electrical contact comprises an electrical contact plug assembly.

4. An apparatus as claimed in claim 1 in which the card has a projection on one side which projection comprises said guide projection, said projection coacting with said first track to cause the card to be skewed with respect to the tracks upon initial insertion of the card.

5. An equipment rack comprising:
- a circuit module housing having two parallel walls, and each wall having a track wherein said tracks are parallel and aligned with a first of said tracks are a recess and a first electrical connector adapted to engage an electrical bus; and
- a circuit card module to be adapted to slide along the tracks between said walls into the housing, said roodtile having:
  - a second electrical contact extending from a first side said card, where said second electrical contact is adapted to engage said first electrical contact;
  - a guide projection extending from a first side of said card, and adapted to slidably co-act with the first track to skew the module between said tracks such that said second electrical contact clears the first track as the module slides along the tracks, and
  - a second pivot surface on a transverse rear edge of the card module adapted to contact the first pivot, surface to pivot the module so that the first and second connectors electrically engage as the guide projection slides into the recess of the housing.

* * * * *